United States Patent
Plettner et al.

(10) Patent No.: US 6,514,790 B1
(45) Date of Patent: Feb. 4, 2003

(54) METHOD FOR HANDLING A PLURALITY OF CIRCUIT CHIPS

(75) Inventors: Andreas Plettner, Feldafing (DE); Karl Haberger, Planegg (DE); Christof Landesberger, Munich (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 09/786,330

(22) PCT Filed: Sep. 2, 1999

(86) PCT No.: PCT/EP99/06468

§ 371 (c)(1),
(2), (4) Date: May 29, 2001

(87) PCT Pub. No.: WO00/14773

PCT Pub. Date: Mar. 16, 2000

(30) Foreign Application Priority Data

Sep. 3, 1998  (DE) .......................................... 198 40 210

(51) Int. Cl.$^7$ .............................................. H01L 21/44
(52) U.S. Cl. .................... 438/106; 438/107; 438/108; 438/109; 438/110; 438/111; 438/113; 438/115; 438/118; 438/122; 438/125; 395/563; 395/800.14; 395/898
(58) Field of Search ................................ 438/106, 107, 438/108, 109, 110, 111, 113, 115, 118, 122, 125; 395/563, 800.14, 898; 414/935

(56) References Cited

U.S. PATENT DOCUMENTS

| | | | | |
|---|---|---|---|---|
| 5,447,886 A | * | 9/1995 | Rai ........................ 228/180.22 |
| 5,579,441 A | * | 11/1996 | Bezek et al. .................... 706/50 |
| 5,671,530 A | * | 9/1997 | Combs et al. ................. 29/834 |
| 5,765,277 A | * | 6/1998 | Jin et al. ....................... 29/743 |
| 5,809,292 A | * | 9/1998 | Wilkinson et al. ........... 712/222 |
| 5,822,608 A | * | 10/1998 | Dieffenderfer et al. ....... 712/20 |
| 5,840,594 A | | 11/1998 | Tsubouchi et al. |
| 6,338,980 B1 | * | 1/2002 | Satoh .......................... 438/106 |
| 6,451,626 B1 | * | 9/2002 | Lin ............................. 438/108 |
| 6,458,623 B1 | * | 9/2002 | Lin ............................. 438/108 |

FOREIGN PATENT DOCUMENTS

| | | |
|---|---|---|
| EP | 0 082 559 A2 | 6/1983 |
| EP | 0 431 637 A | 6/1991 |
| EP | 0 660 656 B1 | 6/1995 |
| EP | 0 660 657 B1 | 6/1995 |
| JP | 10 107490 A | 4/1998 |

OTHER PUBLICATIONS

Patent Abstracts of Japan, vol. 1998, No. 6, Apr. 30, 1998 (JP 10 041695 A).

* cited by examiner

*Primary Examiner*—Matthew Smith
*Assistant Examiner*—V. Yevsikov
(74) *Attorney, Agent, or Firm*—Beyer Weaver & Thomas LLP

(57) ABSTRACT

In a method for handling in parallel a plurality of circuit chips, which are arranged in a first arrangement, which corresponds to their arrangement in the original wafer, on the surface of an auxiliary carrier, the plurality of circuit chips is picked up by a plurality of pick up devices. The plurality of pick up devices with the picked up circuit chips is moved simultaneously to one or several carriers, in such a way that, simultaneously with the motion, the first arrangement of the circuit chips is changed into a second arrangement, which is different from the first arrangement. Then the circuit chips are simultaneously placed in the second arrangement on the one or several carriers.

5 Claims, 1 Drawing Sheet

METHOD FOR HANDLING A PLURALITY OF CIRCUIT CHIPS

BACKGROUND OF THE INVENTION

1. Field of the Invention

The present invention relates to the parallel handling of a plurality of circuit chips. More particularly, the present invention relates to a simultaneous parallel handling of a plurality of circuit chips by a plurality of pick up devices.

2. Description of Prior Art

The development of contact and non-contact chip cards as well as of non-contact electronic labels has lead to a completely new and rapidly growing market for electronic micro systems with new requirements. Integrated circuits are no longer only installed in large devices or hand systems, but in a "bare" form in chip cards or electronic labels. At present electronic labels as the so-called "throw away electronics" mark the end of this development. This throw away electronics needs cheap chips and integrated circuits respectively. In order to make cheap chips of this kind feasible, special methods for a cheap larger scale production are necessary.

A cheap large scale production will only be feasible, if a parallel manufacture of a plurality of circuit chips in interconnected wafers can be carried out as long as possible. Thus, the integrated circuit contained in a circuit chip is usually completed while the circuit chip is still arranged in the interconnected wafers together with other circuit chips.

Only after the completion of the integrated circuits are the wafers separated into the individual circuit chips.

After the semiconductor wafer has been separated into the individual circuit chips, i.e. diced, they have to be handled in order to be positioned in their final destination, that is on the circuit substrate. After dicing the circuit chips, they are usually still arranged in a pseudo wafer arrangement on an auxiliary substrate. The term pseudo wafer arrangement means that the circuit chips are still positioned in the arrangement and distance of the original wafer, but separated from one another by dicing gaps. When further processed, one individual circuit chip after the other is usually separated from the auxiliary substrate by a pick device and handled for further processing by the pick device.

JP 10041695 A and the associated Patent Abstracts of Japan, Vol. 1998, No. 06, Apr. 30, 1998, explains a chip handling device which comprises a pick up head, which includes a plurality of pick up nozzles with a fixed spatial relation to one another. The pick up head can move freely to move the chips to and to fix the chips in a fixing position.

JP 10107490 A shows a device for the simultaneous picking up of several circuit chips, wherein the device comprises a pick up head with a plurality of pick up nozzles. According to this document, a position relation between the nozzles is recorded by a first camera, while a position relation of chips to be picked up is observed by a second camera. If the result of these observations is that all the pick up nozzles are arranged within a range of tolerance of the chips which guarantees correct picking up of the chips, they are picked up by a simultaneous up-and-down motion of the individual pick up nozzles. However, if the result of this observation is that one of the nozzles is not located within the range of tolerance of a respective chip, then only those chips whose pick up nozzles are located within the range of tolerance are picked up simultaneously. The nozzle which is not located within the range of tolerance is then spatially adjusted by a horizontal motion in order to reach the range of tolerance of the chip to be picked up. After the nozzle has been adjusted, this chip is picked up independently.

SUMMARY OF THE INVENTION

It is the object of the present invention to provide a method permitting parallel treatment of circuit chips even after dicing some out of the wafer.

This object is achieved by a method for the parallel handling of a plurality of circuit chips which are arranged in a first arrangement, which corresponds to the arrangement in the original wafer, on the surface of an auxiliary carrier. In a first step a plurality of circuit chips are picked up by a plurality of pick up devices. Then the plurality of pick up devices with the picked up circuit chips are moved to one or several carriers in such a way that, simultaneous with this motion, the first arrangement of the circuit chips is changed into a second arrangement which is different from the first arrangement simultaneously. Then the circuit chips are placed on the one or several carriers simultaneously.

The first arrangement of the circuit chips preferably defines first distances between the circuit chips, while the second arrangement determines second distances between the circuit chips, wherein the first distances are smaller than the second distances. Any device which is appropriate for holding a circuit chip can be used as a pick up device, wherein, e.g., a magnetic clutch, an electrostatic clutch or a vacuum clutch can be used. In addition pick up devices which are provided with an adhesive layer can be used. The individual circuit chips are preferably separated from the auxiliary carriers by adding energy to the joint between the auxiliary carrier and the circuit chip.

The carrier or the carriers the circuit chips are fixed on can be another auxiliary carrier or the circuit substrates which the circuit chips are to remain on for their final destination respectively. If the carriers are the circuit substrates, the circuit chips, simultaneously with positioning of the circuit chips on the circuit substrates, can be flip-chip bonded to these circuit substrates, e.g. by heating the pick up devices. Other methods of bonding or adhering can also be applied.

Thus the present invention eliminates disadvantages of the prior art, where the circuit chips are subjected to an individual processing after they have been separated or diced from one other. Thus, the present invention makes a faster production possible. The length of the process can be decreased by the simultaneous separation of several circuit chips from the pseudo wafer arrangement. By means of a method according to the invention several groups, e.g. 10×10 circuit chips or series of circuit chips, can be removed from an auxiliary carrier simultaneously and applied with a greater distance between them onto a substrate.

According to the present invention several pick heads which comprise a cross sectional area which is smaller than or as big as the area of the circuit chips to be handled are used. The plurality of pick heads are controlled electronically to position the pick heads on a group of circuit chips. Then the circuit chips are separated from the auxiliary substrate. The individual pick heads can be controlled via a handling device in such a way that, after having picked up the circuit chips, they can be moved apart from each other in a fan shaped form. Then the individual circuit chips can be placed, that is bonded or adhered, in a parallel way, that is simultaneously, or sequentially on the respective carriers, that is the circuit substrate that comprises the electric contacts necessary for contacting the circuit chips, for the final destination.

BRIEF DESCRIPTION OF THE DRAWING

Preferred embodiments of the present invention are described herein after making reference to the appended drawings, in which.

DESCRIPTION OF PREFERRED EMBODIMENTS OF THE INVENTION

Figure 1A:
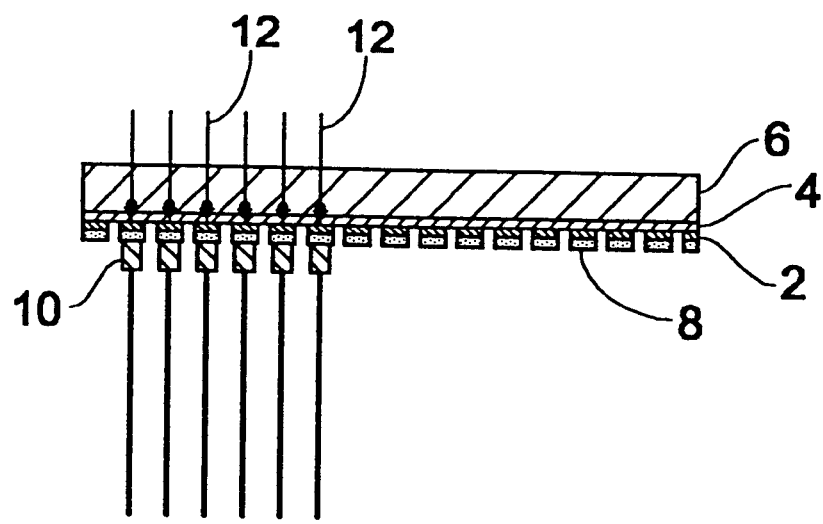
FIGS. 1a and 1b are schematic views for illustrating the method according to the invention.

FIG. 1a shows a plurality of circuit chips 2, which are attached to an auxiliary substrate 6 via an adhesive layer 4. The circuit chips 2 are arranged in a planar way over the whole main surface of the auxiliary substrate 6.

At first it is explained how the structure consisting of the auxiliary substrate 6 and the circuit chips 2, shown in FIG. 1a, can be achieved. The method starts from a semiconductor wafer, wherein integrated circuits are formed in its main surface. Then a trench structure, which determines the outlines of the circuit chips to be diced, is formed in this main surface of the semiconductor wafer, wherein the depth of the trench structure defines the thickness of the circuit chips. Then this semiconductor wafer's surface, in which the trench structure is formed, is applied on an auxiliary substrate 6, e.g. by an adhesive layer 4. Then the semiconductor wafer is thinned from the back side to the lower side of the trench structure, whereby the structure, shown in FIG. 1a, in which the individual circuit chips are separated from one another by the trench structure 8, is formed. For handling these separated circuit chips according to the present invention a plurality of pick heads 10 are then positioned in the vicinity of a plurality of circuit chips 8. For a better understanding FIG. 1a shows six pick heads 10. These pick heads can be arranged in a line or form a planar matrix of e.g. 6×6 pick heads in order to simultaneously pick up 36 circuit chips. The pick heads can pick up the circuit chips by any suitable technology, e.g. by magnetic attraction, electrostatic attraction or attraction by means of a vacuum. Alternatively the pick heads 10 may comprise an adhesive layer on the surface, which comes in contact with the circuit chips 8.

In order to separate the circuit chips 8 from the auxiliary substrate 6, energy is added to the joints between the circuit chips 8 and the auxiliary substrate 6 by suitable devices. In preferred embodiments laser irradiation of the joints is carried through for this purpose. Alternatively supersonic irradiation or heat treatment can be applied in order to separate the connection between the circuit chips 8 and the auxiliary substrate 6. In addition the connection between the circuit chips 8 and the auxiliary substrate 6 can also be separated by ultraviolet light irradiation. A further means of separating the circuit chips is to separate the circuit chips from the auxiliary substrate 6 by wet chemical means, i.e. by locally adding a solvent via a hollow needle. Furthermore, the circuit chips can also be separated from the auxiliary substrate 6 in a dry chemical way by locally generating a plasma. This process of separation can, as FIG. 1a shows, be performed locally by a plurality of suitable devices 12, respectively. Alternatively only one device can be used, by which all the circuit chips, on which pick heads 10 are arranged, can be separated simultaneously from the auxiliary substrate 6.

Although the device or devices 12 in FIG. 1a are arranged in such a way, that the energy is added from the back side of the auxiliary substrate 6, it is obvious to those skilled in the art that this energy can, for example, also be supplied from the side or by means of the pick heads 10 themselves.

Alternatively the circuit chips can be attached to the auxiliary substrate by electrostatic or magnetic clutches. It is also possible to attach the circuit chips to the auxiliary substrate by a vacuum. In these cases it is only necessary to turn off the respective fixing mechanism for the respective circuit chips to separate the circuit chips from the auxiliary substrate.

The pick heads 10 are connected with a positioning device of a chip handling system. The positioning device can comprise any structure known in robotics, as long as it is capable of controlling the plurality of pick heads 10, in order to carry out a shifting of the circuit chips 8 simultaneously with enlarging the distances between them in a fan-like manner. This happens when the positioning device moves the pick heads 10 in such a way as it is shown by the arrow 14 between FIGS. 1a and 1b.

Figure 1B:
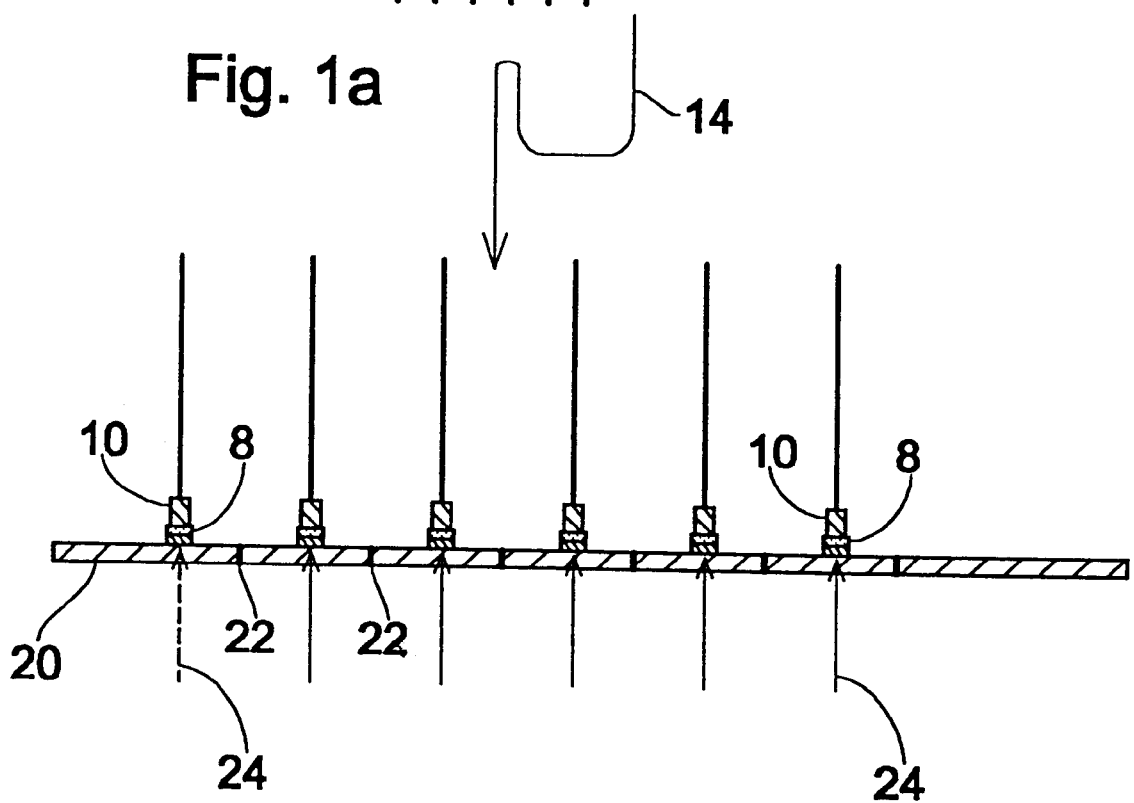

The circuit chips 8 which have been separated from the auxiliary substrate 6 are supported on the pick heads 10 and are moved together with the pick heads 10 by the positioning device. FIG. 1b shows how the circuit chips 8 are then placed by the positioning device with an increased distance between the circuit chips onto the circuit substrates, on which they are to be bonded for their prescribed use. These circuit substrates are shown in FIG. 1b as a substrate compound 20, wherein FIG. 1b also shows separating lines 22, where these substrates will be separated or diced later on. Simultaneously with the placing of the circuit chips 8 by means of the pick heads 10 onto the substrates of the substrate compound 20 a bonding of the circuit chips 8 with bond pads arranged on the circuit substrates can be carried out, e.g. by the generation of a flip-chip connection. For this purpose, devices 24 are provided to make such a bonding possible, when energy is supplied. The devices 24 can also be integrated into the pick heads 10. Alternatively adhesive faces can be provided on the circuit substrates, onto which the circuit chips 8 are glued.

Thus, the present invention provides a method for handling a plurality of circuit chips, wherein the method makes a quick and cost-efficient production of for example electronic labels possible. Thus, the present invention makes large scale production for such electronic labels possible by simultaneous separating a plurality of circuit chips from an auxiliary carrier, fanning out the distance between the circuit chips in a suitable way and placing the circuit chips for example in the recess of an insulating substrate, on which an antenna device is provided.

What is claimed is:

1. A method for the handling in parallel a plurality of circuit chips, which are arranged in a first arrangement, which corresponds to their arrangement in the original wafer, on the surface of an auxiliary carrier, comprising the following steps:

picking up a plurality of circuit chips by a plurality of pick up devices;

simultaneously moving a plurality of pick up devices with the picked up circuit chips to one or several supports in such a way that simultaneously with the motion the first arrangement of the circuit chips is changed into a second arrangement, which is different from the first arrangement; and simultaneously placing the circuit chips in the second arrangement onto one or several carriers.

2. The method of claim 1, wherein the respective circuit chips comprise first distances between the circuit chips, when they are in the first arrangement, and wherein the respective circuit chips comprise second distances between the circuit chips, when they are in the second arrangement.

3. The method of claim 2, wherein the first distances are smaller than the second distances.

4. The method of claim 1, wherein the picking up of a respective integrated circuit chip is effected by a respective pick up device by a magnetic clutch, an electrostatic clutch, a vacuum clutch or an adhesive layer on a respective pick up device.

5. The method of claim 1, wherein the respective circuit chips are separated from the auxiliary support by adding energy to the place of connection between the auxiliary support and the circuit chip, if the same are picked up by the respective pick up devices.

* * * * *